United States Patent [19]

Kuenemund

[11] 4,124,829
[45] Nov. 7, 1978

[54] ELECTROMECHANICAL FILTER
[75] Inventor: Friedrich Kuenemund, Munich, Germany
[73] Assignee: Siemens Aktiengesellschaft, Berlin & Munich, Germany
[21] Appl. No.: 760,730
[22] Filed: Jan. 19, 1977
[30] Foreign Application Priority Data
Feb. 26, 1976 [DE] Fed. Rep. of Germany ....... 2607879
[51] Int. Cl.$^2$ ................. H03H 9/26; H03H 9/04; H04R 17/10; H01L 41/04
[52] U.S. Cl. .................................. 333/71; 310/321; 333/72
[58] Field of Search ............... 333/71, 72, 30 M, 70 S; 310/321, 328–331, 333
[56] References Cited
U.S. PATENT DOCUMENTS
3,389,351  6/1968  Trzeba et al. .................. 333/71
3,986,151  10/1976  Kanazawa et al. .............. 333/71

FOREIGN PATENT DOCUMENTS
1,541,975  12/1969  Fed. Rep. of Germany ............ 333/71

Primary Examiner—Alfred E. Smith
Assistant Examiner—Marvin Nussbaum
Attorney, Agent, or Firm—Hill, Gross, Simpson, Van Santen, Steadman, Chiara & Simpson

[57] ABSTRACT

An electromechanical filter comprising a plurality of parallel mounted mechanical resonators which are generally cylindrical in shape with a plurality of input and output resonators operating in a bending mode and at least one intermediate mechanical resonator operating in a torsional mode and being generally dumbbell shaped with two or more cylindrical portions connected by a torsion member and with electrostrictive transducer input and output members connected to the input and output resonators so as to provide filters having wide band characteristics.

10 Claims, 3 Drawing Figures

ELECTROMECHANICAL FILTER

BACKGROUND OF THE INVENTION

1. Field of the Invention

This invention relates in general to electromechanical filters and in particular to a novel electromechanical filter.

2. Description of the Prior Art

Mechanical filters have proved very advantageous for frequency selecting and filtering in transmission of electrical communication signals because of the high quality of the individual resonators which makes it possible to obtain with very small construction relative to electrical LC filter circuits superior results. Electromechanical filters also have very good temperature characteristics in that their frequency response varies very little if any with temperature changes.

Mechanical resonators can oscillate in various modes as, for example, the longitudinal mode, the torsional mode and the bending mode. The resonators must also be mechanically coupled together and it is necessary in constructing mechanical filters to suitably select the most desirable oscillation mode for the resonators as well as the proper mechanical coupling elements. The bending mode is a particular advantageous oscillation mode for the resonators since a resonator operating in the bending mode has a resonant frequency which is dependent upon its length and also upon the cross-sectional moment of inertia in the oscillation direction. The cross-sectional moment of inertia is determined by the cross-sectional area and shape and, thus, for an oscillator operating in the bending mode not only its length but also its cross-section can be selected to establish the resonant frequency. An advantageous method of coupling resonators operating in the bending mode can consist of longitudinal coupling wires which have small cross-section and such wires of small cross-section provide relatively stable coupling and it is thus possible to construct filters having relatively large band width characteristics as, for example, for use in the carrier frequency transmission field. Because of the small cross-sectional area of the longitudinal coupling wires, such filters are only slightly susceptible to so-called secondary waves, in other words, of undesired spurious oscillations of the overall filter system since such secondary waves are only slightly coupled to the individual resonators.

Mechanical filters such as described above are shown in German Pat. No. 15 41 975. This patent also discusses another problem which exists in mechanical filters which is the production of attenuation poles in the transmission characteristic of the filter. The introduction of attenuation poles can be accomplished in a known manner to achieve a rise in the gradient of the attenuation characteristic at desired frequency points which makes it possible to avoid the use of filter resonators and this is particularly desirable when the filter must be constructed so as to fit into a small space. In addition, the use of a smaller number of resonators allows a reduction in the group transit time of the signals in the pass band.

In German Pat. No. 15 41 975, at least one additional coupling element is used for the production of attenuation poles and such additional coupling element additionally connects to other resonators which directly join each other in the electrical mode of operation. The physical mode of operation of such additional coupling elements provides for the signal clamping and extinction of specific frequencies so that such frequencies will not be transmitted through the resonators. This frequency is designated the pole frequency and in known arrangements for the production of this mode of operation it is necessary to provide an additional coupling element which extends obliquely relative to the main coupling element which is the coupler which determines the band width so as to connect different sections oscillating in phase opposition of the resonators which are coupled by the additional coupling element. Oblique coupling elements of this type are fundamentally difficult to construct and install in a practical embodiment for two reasons. Additional bending components are present in such additional coupling element and cause attenuation distortions since the longitudinal oscillation is also used as a useful oscillation for the obliquely arranged additional coupling element. Furthermore, the coupling element must be attached to the resonators at points at which the bending amplitude of the resonators change considerably in dependence upon the local position and it becomes very difficult in large scale production to manufacture a plurality of such filters which have properties that are as far as possible identical to one another due to the criticality of the attaching points of the obliquely arranged coupling wires.

SUMMARY OF THE INVENTION

The present invention relates to an electromechanical filter comprising a plurality of mechanical resonators which are mounted parallel to each other and are generally rod shape and are arranged next to each other in a plane and are coupled to each other with at least one coupling wire and have input and output electrostrictive transducer members for converting electrical energy into mechanical energy and converting mechanical energy into electrical energy and wherein at least one additional resonating element and at least one additional coupling element provides at least one attenuation pole.

It is an object of the present invention to provide a mechanical filter which has attenuation poles in the filter characteristic by using one or more additional coupling elements and wherein the additional coupling elements are parallel to the longitudinal axis of the filter.

The filter of the invention comprises a plurality of rod shaped resonators mounted parallel to each other and lying next to each other in a plane and which are coupled to each other with at least one coupling wire and with electrostrictive transducer input and output means connected to the ends of the filter for converting electrical energy into mechanical energy and for converting mechanical energy into electrical energy and wherein at least one additional coupling element which serves to produce at least one attenuation pole is provided and wherein in the filter of the invention which comprises predominantly resonators operating in the bending mode also contains at least one resonator operating in the torsional mode which at least one of the additional coupling elements engages.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
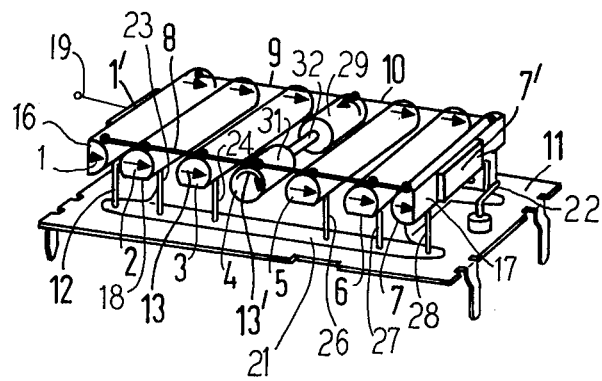
FIG. 1 illustrates a mechanical filter of the invention comprising resonators operating in the bending mode and with a resonator operating in the torsional mode mounted in the central portion of the filter.

FIG. 1 illustrates a mechanical filter comprising seven resonators, 1 through 7, with the resonators 1 through 3 and 5 through 7 operating in the bending mode and being generally cylindrical in shape and mounted parallel to each other and formed with flatted sides. The arrows 13 illustrate the oscillation direction at a specific time. The central resonator 4 is a torsional resonator and comprises cylindrical end portions 29 and 31 joined by a rod 32 and at a specific instant of time the cylindrical portions 29 and 31 move in the direction of the arrows 13'. The individual bending resonators 1 through 3 and 5 through 7 are supported from the base plate 11 by support members 12, 23, 24, 26, 27 and 28 at oscillation node points of the resonators. Electrostrictive drive and output means comprising ceramic plates 1' and 7' are attached to the end resonators 1 and 7 and have input and output leads 19 and 22 respectively, as shown. The static capacitances of the plates 1' and 7' are represented by the inductances 1' and 7' in the electrical schematic of FIG. 3 because the so-called force-current analogy is used for determining the electrical equivalent circuit diagram.

Figure 3:
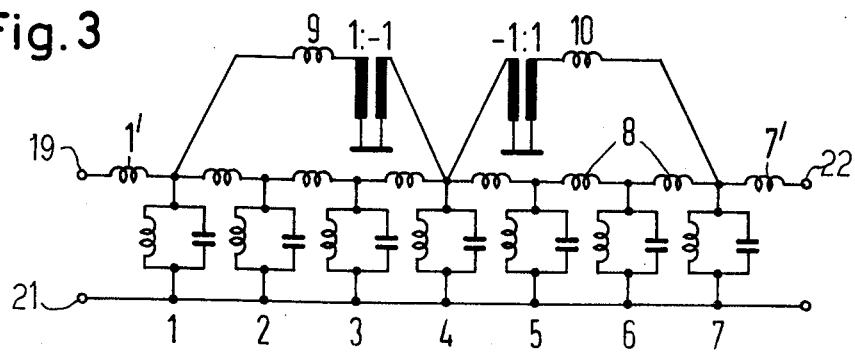
FIG. 3 is an electrical schematic circuit diagram illustrating the equivalent circuit for the mechanical filters of FIGS. 1 and 2.

As is illustrated in FIG. 1, the bending resonators 1 through 3 and 5 through 7 are formed with flatted sides as, for example, the end resonators 1 and 7 are formed with flatted sides which define (16,17) planes that are normal to the base plate 11 and the inner resonators 2, 3, 5 and 6 are formed with flatted sides such as the flatted side 18 of the resonator 2 which are parallel to the plate 11. The individual resonators 1 through 3 and 5 through 7 are supported from the base plate 11 by the standoffs which can comprise metallic support legs 12, 23, 24, 26, 27 and 28 which support the metallic resonators and the base plate 11 represents an electrical reference potential as illustrated in FIG. 3 by the reference potential 21. The input may be applied to the terminal between the ground potential 21 and the input terminal 19 and the output may be taken from the lead 22 and the ground plate 21.

The resonators are coupled together by a coupling wire 8 which is attached at the surface of the resonators 1 through 7 by spot welding and the coupling wire itself executes longitudinal oscillations and its length and cross-section must be such that the required band width can be achieved by the filter. For providing attenuation poles, additional coupling wires 9 and 10 are provided with the coupling wire 9 attached to the surface of the resonator 1 at the end away from the wire 8 and the other end of wire 9 connected to the surface of cylindrical member 29 of the torsional resonator as shown in FIG. 1. The coupling wire 10 is also attached to the surface of the cylindrical member 29 of the torsional resonator and its other end is connected to the surface of the bending resonator 7 at the end opposite from the end connected to the coupling wire 8.

In the illustrated embodiment for clarity, the torsional resonator 4 is designed as a resonator of circular cross-section but the torsional resonator may also be provided with additional flattenings on the outer surface which allows determinable connections to the coupling elements 8, 9 and 10 to be made. It is also possible for the torsional resonator 4 which as shown is supported only by the coupling elements 8, 9 and 10 to be supported by additional supporting members and engage the torsional resonator at oscillation nodes.

The embodiment illustrated in FIG. 1 is advantageous as a filter because the torsional resonator 4 is designed in the form of a dumbbell or a pair of cylindrical members 29 and 31 separated by the torsional rod 32 and the constricted cross-sectional portion 32 provides a very desirable resonator characteristic. Since different physical laws control the resonant frequency of the bending resonators and the torsional resonator, generally the torsional resonator 4 would be of greater length than the bending resonators 1 through 3 and 5 through 7 particularly because the torsional resonator has an additional characteristic in that its self resonance should lie within the pass band of the filter.

In operation, when an input having frequencies within the pass band of the filter is applied to the terminals 19 and 21, the transducer 1' will cause the first bending resonator 1 to move in a bending oscillation which will in turn excite the coupling wire 8 causing the resonators 2, 3, 5, 6 and 7 to oscillate in the bending mode and the resonator 4 to oscillate in the torsional mode. The coupling wires 9 and 10 also couple energy from the resonator 1 to the resonator 4 and from the resonator 4 to the resonator 7 and the output of the filter removed from terminals 22 and 21 at the output of the transducer 7' will be the filter output of the filter.

Figure 2:
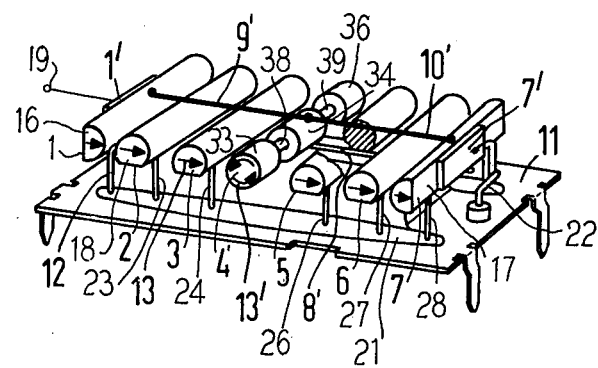
FIG. 2 illustrates a modification of the filter illustrated in FIG. 1 wherein the torsional mode resonator is of a different form than that illustrated in FIG. 1.

FIG. 2 illustrates a modification of the filter of FIG. 1 wherein the torsional resonator 4 of FIG. 1 has been replaced by torsional resonator 4' which comprises three cylindrical portions 33, 34 and 36 separated by reduce cross-sectional rods 38 and 39. Furthermore, the coupling wires or elements 8, 9 and 10 have been moved in the embodiment of FIG. 2 from that shown in FIG. 1. For example, coupling rod 9' is placed at the center of the filter and extends from the center of resonator 1 on its outer surface to the surface of the center cylindrical member 34 of the torsional resonator 4'. The coupling element or rod 10' extends from the surface of the center cylindrical member 34 of the resonator 4' to the center of the output bending resonator 7 as shown in FIG. 2. The main coupling element 8' is connected to the underside of the bending mode resonators 1, 2, 3 and 5, 6 and 7 and to the underside of the center cylindrical member 34 of the torsional resonator 4' as is shown in cutaway in FIG. 2. Thus, the coupling wires 8', 9' and 10' in FIG. 2 are connected to the center of the resonant elements rather than to the ends as in FIG. 1 and the center torsional resonator 4' has three cylindrical sections and two sections of reduced cross-sectional areas 38 and 39 as shown.

A characteristic of the embodiments illustrated in FIGS. 1 and 2 is that a half wave length or a wave length torsional dumbbell resonator is used for phase rotation of 180° which is required for producing attenuation poles. The fact is exploited that the movement of the surfaces of the cylindrical members 29 and 31 in FIG. 1 embodiment move in opposite directions as shown by the arrows whereas in the FIG. 2 embodiment the wires are placed on opposite sides of the cylindrical portion 34 which also move in opposite directions and thus have a phase difference of 180°. Examples of FIGS. 1 and 2 are particularly advantageous because only one torsional resonator and one additional coupling wire is required to achieve a total of four attenuation poles of which two lie below the filter pass band and two above the filter pass band.

The electrical equivalent circuit of FIG. 3 uses the so-called force-current analogy wherein the resonators 1 through 7 represent parallel L-C resonant circuits which are identified by the numerals 1 through 7 and the main coupling wire 8 comprises the series inductances between the transducers 1' and 7'. The coupling wires 9 and 10 can be illustrated by the parallel inductances 9 and 10 which respectively extend from the resonators 1 to 4 and 4 to 7. The previously mentioned phase reversal for the additional coupling elements 9 and 10 in combination with the torsional resonator 4 are represented by the inductances 9 and 10 and the transformers having the transformation ratio of 1:−1 as shown.

It is seen that the present invention provides an improved electromechanical filter which is simple and inexpensive to construct and although the invention has been described with respect to preferred embodiments it is not to be so limited as changes and modifications may be made therein which are within the full intended scope as defined by the appended claims.

I claim as my invention:

1. An electromechanical filter comprising a plurality of mechanical resonators which are mounted with their axes parallel and are in the form of rods, and lie next to each other in a plane, at least one coupling wire attached to said plurality of resonators to couple them together, input and output electrostrictive transducers connected to the first and last of said resonators and converting electrical energy into mechanical energy and converting mechanical energy into electrical energy, at least one of said plurality of resonators operating in the torsional mode and at least one additional coupling element for producing at least one attenuation pole connected to said resonator operating in the torsional mode and to at least one other of said resonators which operates in the bending mode.

2. An electromechanical filter as claimed in claim 1, wherein at least some of said plurality of resonators are provided with a flattened side, a base member and a plurality of support elements attached to said base member and to said some of said plurality of resonators to engage them at their oscillation nodes.

3. An electromechanical filter according to claim 1, wherein said resonator operating in the torsional mode is shaped like a dumbbell resonator with two cylindrical portions joined by a portion of smaller cross-section and having a length approximately equal to the lengths of said resonators operating in the bending mode.

4. An electromechanical filter according to claim 1, wherein said coupling wire and said additional coupling element are connected to said resonators intermediate their ends and adjacent their centers.

5. An electromechanical filter comprising a first plurality of resonators mounted parallel to each other in a plane for vibration in a bending mode, a second plurality of resonators mounted parallel to each other in said plane for vibration in a bending mode, a torsional resonator mounted between said first and second plurality of resonators for vibration in a torsional mode, a coupling wire connected to said first and second plurality of resonators and to said torsional resonator, an input transducer connected to a first one of said first plurality of resonators, an output transducer connected to the last one of said second plurality of resonators, and a first secondary coupling wire connected between said first one of said first plurality of resonators and said torsional resonator.

6. An electromechanical filter according to claim 5 including a second secondary coupling wire connected between said torsional resonator and said last one of said second plurality of resonators.

7. An electromechanical filter according to claim 6, wherein said torsional resonator comprises first and second cylindrical portions joined by a reduced cross-sectional portion and said coupling wire attached to said first and second plurality of resonators adjacent first ends thereof and attached to said torsional resonator ajacent one end thereof and to said first cylindrical member.

8. An electromechanical filter according to claim 7 wherein said first secondary coupling wire is attached to said first one of said first plurality of resonators adjacent the second end and to said torsional resonator adjacent the second end and to said second cylindrical member, said second secondary coupling wire is attached to said last one of said second plurality of resonators adjacent the second end and to said torsional member adjacent the second end and to said second cylindrical member.

9. An electromechanical filter according to claim 6, wherein said torsional resonator comprises first, second and third cylindrical portions joined by first and second portions of reduced cross-sectional area with said first reduced cross-sectional portion extending between said first and second cylindrical portions and said second reduced cross-sectional portion extending between said second and third cylindrical portions, and said coupling wire attached to said first and second plurality of resonators at their centers and to said second cylindrical portion at its center.

10. An electromechanical filter according to claim 9, wherein said first secondary coupling wire is attached to said first one of said first plurality of resonators at its center and to said second cylindrical portion at its center, said second secondary coupling wire attached to said last one of said second plurality of resonators at its center and to said second cylindrical portion at its center, and said first and second secondary coupling wires mounted to said first and second plurality of resonators and to said second cylindrical portion on the sides opposite to the sides to which said coupling wire is attached.

* * * * *